United States Patent
Oh et al.

(10) Patent No.: US 9,504,160 B2
(45) Date of Patent: Nov. 22, 2016

(54) SEMICONDUCTOR MEMORY DEVICE

(71) Applicant: Samsung Electronics Co., Ltd., Suwon-si, Gyeonggi-do (KR)

(72) Inventors: Teck-su Oh, Anyang-si (KR); Sung-ki Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 10 days.

(21) Appl. No.: 14/548,261

(22) Filed: Nov. 19, 2014

(65) Prior Publication Data

US 2015/0138735 A1    May 21, 2015

(30) Foreign Application Priority Data

Nov. 20, 2013  (KR) .................. 10-2013-0141590

(51) Int. Cl.

| H05K 5/00 | (2006.01) |
|---|---|
| H05K 1/18 | (2006.01) |
| H01R 12/70 | (2011.01) |
| H05K 1/11 | (2006.01) |
| H01R 12/72 | (2011.01) |

(52) U.S. Cl.
CPC .......... *H05K 1/181* (2013.01); *H01R 12/7082* (2013.01); *H01R 12/721* (2013.01); *H05K 1/117* (2013.01); *H05K 2201/10159* (2013.01); *Y02P 70/611* (2015.11)

(58) Field of Classification Search
USPC ....... 361/792, 728–730, 737, 752, 796, 800; 439/61, 62, 67, 77
See application file for complete search history.

(56) References Cited

U.S. PATENT DOCUMENTS

| 3,736,471 A | * | 5/1973 | Donze | ................... | H05K 1/144 |
| | | | | | 361/679.31 |
| RE34,161 E | * | 1/1993 | Nakagawa | .............. | A63F 13/02 |
| | | | | | 273/148 B |
| 6,491,526 B2 | * | 12/2002 | Leman | ................... | G06F 1/184 |
| | | | | | 361/752 |

(Continued)

FOREIGN PATENT DOCUMENTS

| KR | 100356800 | 10/2002 |
| KR | 20040058417 A | 7/2004 |
| KR | 20060007205 A | 1/2006 |

*Primary Examiner* — Hung S Bui
(74) *Attorney, Agent, or Firm* — Renaissance IP Law Group LLP

(57) ABSTRACT

A semiconductor memory device is included. The semiconductor device includes a semiconductor memory device, comprising: a first substrate including a first semiconductor device mounted on the first substrate and a first connection terminal disposed at an edge of the first substrate; a second substrate including a second semiconductor device mounted on the second substrate and a second connection terminal at an edge of the second substrate; and an interface connector including a first socket portion configured to receive the first connection terminal and a second socket portion configured to receive the second connection terminal. The interface connector further includes: first socket terminals of the first socket portion are connected with the first connection terminals; second socket terminals of the second socket portion are connected with the second connection terminals; and an internal wiring for electrically connecting the first socket terminals with the second socket terminals.

16 Claims, 9 Drawing Sheets

(56) References Cited

U.S. PATENT DOCUMENTS

| | | | |
|---|---|---|---|
| 6,542,373 B1* | 4/2003 | Oba | H05K 1/117 174/261 |
| 6,696,754 B2 | 2/2004 | Sato et al. | |
| 6,891,729 B2 | 5/2005 | Ko et al. | |
| 7,045,891 B2* | 5/2006 | Choi | H05K 1/142 257/723 |
| 7,172,432 B2* | 2/2007 | Campini | H05K 1/144 361/736 |
| 7,285,975 B2* | 10/2007 | Kyung | G06F 13/4086 326/30 |
| 7,540,743 B2 | 6/2009 | Park et al. | |
| 7,602,611 B2* | 10/2009 | Peng | G06F 1/181 361/728 |
| 7,715,200 B2 | 5/2010 | Cho et al. | |
| 7,768,789 B2* | 8/2010 | Ni | H05K 5/0269 361/730 |
| 7,864,544 B2 | 1/2011 | Smith et al. | |
| 8,184,442 B2 | 5/2012 | Fujimura et al. | |
| 2001/0015485 A1* | 8/2001 | Song | H01L 23/055 257/679 |
| 2008/0002370 A1 | 1/2008 | Lau et al. | |
| 2008/0030943 A1 | 2/2008 | Kim et al. | |
| 2011/0211310 A1 | 9/2011 | Farling et al. | |
| 2012/0250279 A1* | 10/2012 | Harashima | G06F 1/187 361/760 |
| 2013/0107480 A1 | 5/2013 | Bibee | |

* cited by examiner

SEMICONDUCTOR MEMORY DEVICE

CROSS-REFERENCE TO RELATED APPLICATION

This application claims the benefit of Korean Patent Application No. 10-2013-0141590, filed on Nov. 20, 2013, in the Korean Intellectual Property Office, the disclosure of which is incorporated herein in its entirety by reference.

BACKGROUND

Embodiments relate to a semiconductor memory device, and more particularly, to a semiconductor memory device that is favorable to miniaturization, is easy to manufacture, and is partially replaceable.

For electronic devices, small sizes and high capacities have been demanded at the same time. Although the number of semiconductor devices mounted on a substrate having a limited area needs to be increased for high capacities, the area of the substrate needs to be reduced for small sizes. To meet the conflicting needs, a scheme has been proposed in which semiconductor devices to be mounted on one large substrate are mounted on two smaller substrates. To electrically connect the two smaller substrates, connectors are provided corresponding to positions of the substrates, respectively, for interconnection or a flexible printed circuit board is used. However, these methods are not useful because the semiconductor devices are mountable on only facing surfaces or utilization of the area is not efficient.

SUMMARY

An embodiment includes a semiconductor device including a semiconductor memory device, comprising: a first substrate including a first semiconductor device mounted on the first substrate and a first connection terminal disposed at an edge of the first substrate; a second substrate including a second semiconductor device mounted on the second substrate and a second connection terminal at an edge of the second substrate; and an interface connector including a first socket portion configured to receive the first connection terminal and a second socket portion configured to receive the second connection terminal. The interface connector further includes: first socket terminals of the first socket portion are connected with the first connection terminals; second socket terminals of the second socket portion are connected with the second connection terminals; and an internal wiring for electrically connecting the first socket terminals with the second socket terminals.

An embodiment includes a semiconductor memory device comprising: a first substrate including a first semiconductor device mounted on the first substrate and a first connection terminal disposed at an edge of the first substrate; a second substrate including a second semiconductor device mounted on the second substrate and a second connection terminal disposed at an edge of the second substrate; an interface connector comprising a first socket portion configured to receive the first connection terminal and a second socket portion configured to receive the second connection terminal; and a case exposing the interface connector and configured to receive the first substrate and the second substrate. A main connector terminal is disposed on a surface of the interface connector.

An embodiment includes a semiconductor memory device, comprising: an interface connector comprising a plurality of socket portions disposed on a side of the interface connector; a plurality of substrates, each substrate including a semiconductor device and including a connection terminal contacting a corresponding socket portion of the interface connector; a case substantially surrounding the substrates and including an opening; and a main connector terminal disposed on one of the substrates. A semiconductor device of the substrates without the main connector terminal are configured to be accessed through the main connector terminal and the interface connector.

BRIEF DESCRIPTION OF THE DRAWINGS

Some embodiments will be more clearly understood from the following detailed description taken in conjunction with the accompanying drawings in which.

DETAILED DESCRIPTION OF THE EMBODIMENTS

Figure 1:
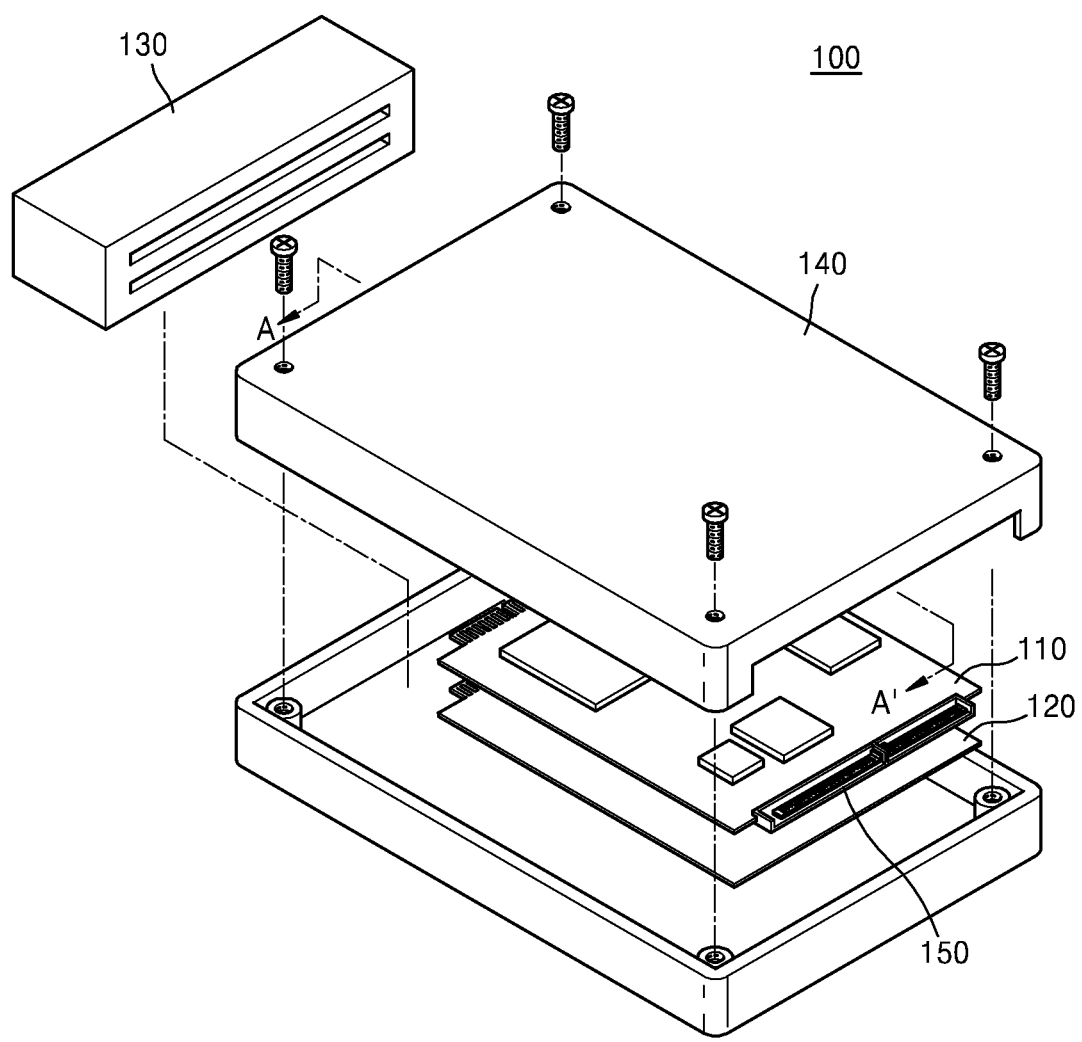
FIG. 1 is a perspective view illustrating a structure of a semiconductor memory device according to some embodiments.

As used herein, the term "and/or" includes any and all combinations of one or more of the associated listed items. Expressions such as "at least one of," when preceding a list of elements, modify the entire list of elements and do not modify the individual elements of the list.

Embodiments will now be described more fully with reference to the accompanying drawings. Embodiments may, however, take many different forms and should not be construed as being limited to the particular embodiments set forth herein; rather, these embodiments are disposed so that this description will be thorough and complete, and will fully convey the concept to those skilled in the art. Like reference numerals refer to like components. Various elements and areas in the drawings are schematically drawn. Therefore, embodiments are not limited by a relative size or interval drawn on the drawings.

Although ordinal numbers such as "first," "second," and so forth will be used to describe various components, those components are not limited by the terms. The ordinal terms are used only for distinguishing one component from another component. For example, a first component may be referred to as a second component and the second component may also be referred to as the first component, without departing from the scope as defined herein.

The terminology used herein is for the purpose of describing embodiments only and is not intended to be limiting. As used herein, the singular forms are intended to include plural forms as well, unless the context clearly indicates otherwise. It will be further understood that the terms "comprises" and/or "has," when used herein, specify the presence of a stated feature, number, step, operation, component, element, or a combination thereof but do not preclude the presence or addition of additional features, numbers, steps, operations, components, elements, or combinations thereof.

Unless defined otherwise, all terms used herein including technical or scientific terms have the same meanings as those generally understood by those of ordinary skill in the art to which the embodiments may pertain. The terms as those defined in generally used dictionaries are construed to have meanings matching that in the context of related technology and, unless clearly defined otherwise, are not construed to be ideally or excessively formal.

FIG. 1 is a perspective view illustrating a structure of a semiconductor memory device 100 according to some embodiments.

Referring to FIG. 1, the semiconductor memory device 100 may include a first substrate 110, a second substrate 120, and an interface connector 130 including a first socket portion and a second socket portion into which the first substrate 110 and the second substrate 120 may be inserted, respectively. The semiconductor memory device 100 may include a case 140 that receives the first substrate 110 and the second substrate 120.

The first substrate 110 and the second substrate 120 are electrically connected to each other by an internal wiring disposed in the interface connector 130. Semiconductor devices may be disposed on the first substrate 110 and the second substrate 120, respectively. By connecting multiple substrates on which the semiconductor devices are disposed with the interface connector 130, a higher capacity of an electronic device may be achieved. Moreover, semiconductor devices conventionally mounted on one substrate are mounted on two smaller substrates connected by the interface connector 130, thereby achieving an increased miniaturization of the electronic device.

Although the two substrates 110 and 120 are illustrated as being connected by the interface connector 130 in FIG. 1, other embodiments are not limited to this example. More specifically, three or more substrates may be electrically connected to one another by the interface connector 130.

The first substrate 110 and the second substrate 120 are inserted into the interface connector 130 for coupling to each other, such that they are stacked in parallel with each other.

The case 140 is intended to protect the first substrate 110 and the second substrate 120 and may be configured to receive all of the substrates 110 and 120 and the interface connector 130 or to receive the substrates 110 and 120 and expose the interface connector 130.

Figure 2:
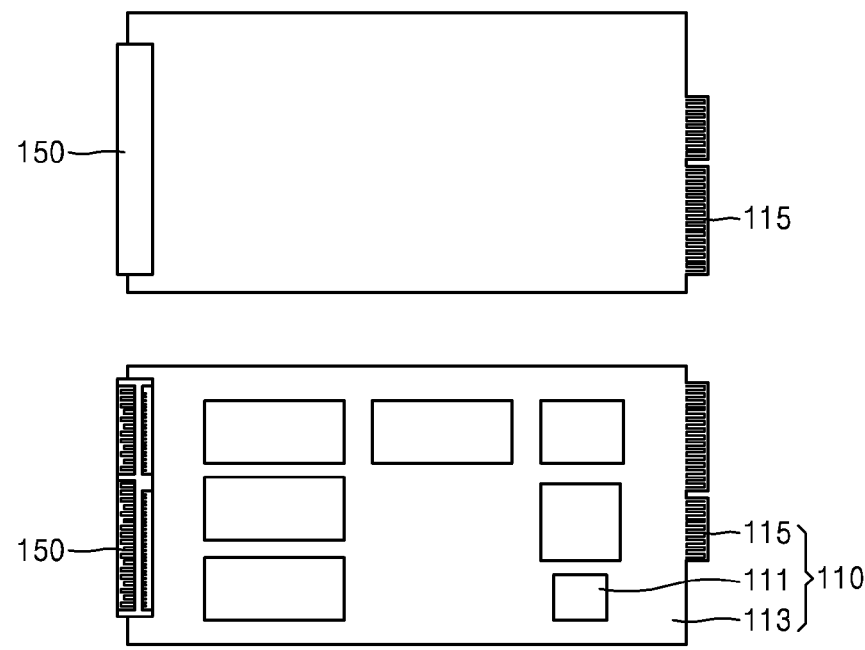
FIG. 2 is a plan view illustrating a top surface and a bottom surface of a first substrate of FIG. 1.

FIG. 2 is a plan view illustrating a top surface and a bottom surface of the first substrate 110 of FIG. 1.

Referring to FIG. 2, at least one first semiconductor device 111 is mounted on a first Printed Circuit Board (PCB) 113. First connection terminals 115 are disposed at an edge of the first PCB 113.

A main connector terminal 150 is disposed at an edge of the first PCB 113 other than the edge at which the first connection terminals 115 are disposed. Although various embodiments are described herein with a PCB is used as an example, in other embodiments, any substrate on which semiconductor devices 111, connections terminals 115, and main connector terminals 150 may be mounted or formed may be used.

Hereinafter, each component will be described in detail with reference to the accompanying drawings in each embodiment.

Figure 3:
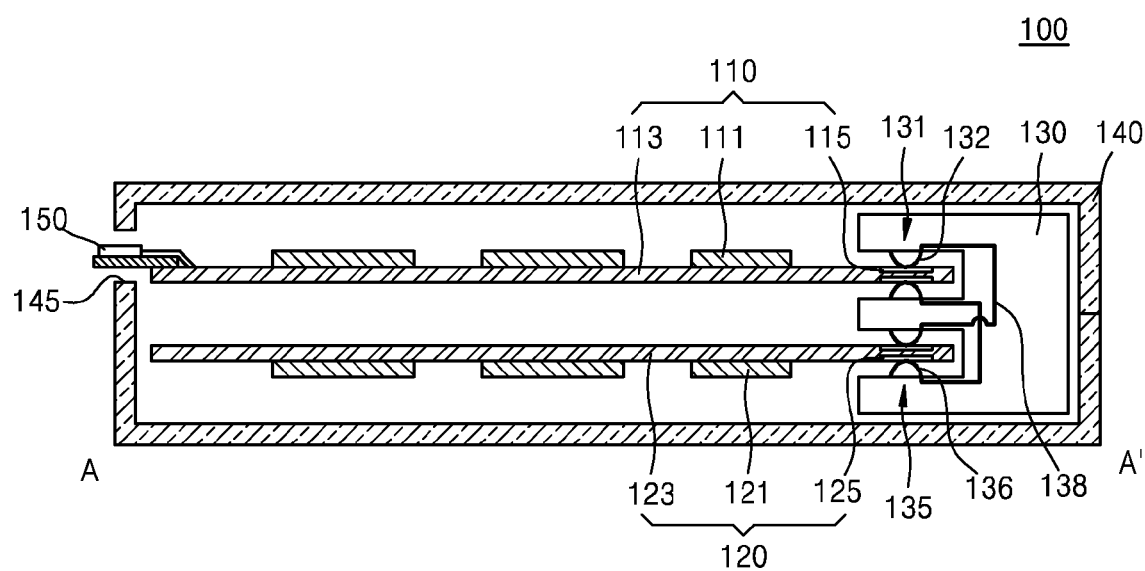
FIG. 3 is a side cross-sectional view illustrating a cross-section taken along a line A-A' of a semiconductor memory device illustrated in FIG. 1.

FIG. 3 is a side cross-sectional view illustrating a cross-section taken along a line A-A' of the semiconductor memory device 100 illustrated in FIG. 1.

Referring to FIG. 3, the semiconductor memory device 100 may include the first substrate 110 and the second substrate 120. The semiconductor memory device 100 may include the interface connector 130 into which the first substrate 110 and the second substrate 120 are inserted for coupling to each other.

The first substrate 110 may include the first PCB 113 on which the first semiconductor device 111 is mounted. The first PCB 113 may be a rigid PCB or a flexible PCB. More specifically, in the first PCB 113, an upper protection layer and a lower protection layer may be formed on and under a body layer, and the first PCB 113 may include terminals for forming electric connections with the first semiconductor device 111.

The first semiconductor device 111 may be mounted on a single surface or both surfaces of the first PCB 113 according to, for example, a surface mounting method and/or an insertion mounting method. More specifically, the first semiconductor device 111 may be mounted on the first PCB 113 by using, but not limited to, a ball grid array (BGA) method, a pin grid array (PGA) method, a tape carrier package (TCP) method, a chip-on-board (COB) method, a quad flat package (QFP) method, and a quad flat non-leaded (QFN) method.

The first semiconductor device 111 may be a logic package that performs a logic operation, or a memory package. The logic package may be, for example, a memory controller, and the memory package may be, for example, a non-volatile memory package. The non-volatile memory may be, but is not limited to, a flash memory, a phase-change random access memory (PRAM), a resistive RAM (RRAM), a ferroelectric RAM (FeRAM), a solid magnetic RAM (MRAM), or the like. The flash memory may be, for example, a NAND flash memory. The memory package may be, for example, a volatile memory package. The volatile memory may be, for example, a dynamic random access memory (DRAM), a static RAM (SRAM), or a synchronous dynamic random access memory (SDRAM). However, the first semiconductor device 111 may include various forms of semiconductor devices manufactured based on a semiconductor substrate. Moreover, although semiconductor devices 111 related to memories have been used as examples, in other embodiments, the semiconductor devices 111 may be related to other types of systems and may be configured to perform other functions.

The first connection terminal 115 may be disposed at an edge of the first substrate 110. The first connection terminal 115 may include multiple terminals, and may be formed on a top surface and/or a bottom surface of an edge of the first PCB 113.

The first connection terminals 115 may be formed by plating a conductor, for example, gold, on the first PCB 113. The first connection terminals 115 may be disposed at equal intervals or different intervals. The first connection terminals 115 may have the same size or different sizes.

The first connection terminals 115 are electrically connected with the first semiconductor device 111 through wirings formed on the first PCB 113. The first connection terminals 115 may include power terminals and/or signal terminals and may be configured to communicate with an external device.

The second substrate 120 may include a second PCB 123 on which the second semiconductor device 121 is mounted. The second PCB 123 may be a rigid PCB or a flexible PCB like the first PCB 113. The second PCB 123 may include terminals for forming electric connections with the second semiconductor device 121.

The second semiconductor device 121 may be mounted on the second PCB 123 by using, for example, a surface mounting method and/or an insertion mounting method, similar to the first semiconductor device 121. A detailed mounting method has been described in regard to the first semiconductor device 111, and thus will not be described in detail.

The second semiconductor device 121 may be a logic package that performs a logic operation, or a memory package, similar to the first semiconductor device 111. The logic package and the memory package have been described in relation to the first semiconductor device 111, and thus will not be described in detail. However, the second semiconductor device 121 may include various forms of semiconductor devices manufactured based on a semiconductor substrate.

A second connection terminal 125 may be disposed at an edge of the second substrate 120. The second connection terminal 125 may include multiple terminals and may be formed on a top surface and/or a bottom surface of an edge of the second PCB 123.

The second connection terminals 125 may be formed by plating a conductor, for example, gold, on the second PCB 123. The second connection terminals 125 may be disposed at equal intervals or different intervals. The second connection terminals 125 may have the same size or different sizes.

The second connection terminals 125 are electrically connected with the second semiconductor device 121 through wirings formed on the second PCB 123. The second connection terminals 125 may include power terminals and/or signal terminals, and may be configured to communicate with an external device.

The interface connector 130 may include a first socket portion 131 for receiving the first connection terminals 115 and a second socket portion 135 for receiving the second connection terminals 125.

More specifically, the first socket portion 131 and the second socket portion 135 are configured such that the edge of the first substrate 110 at which the first connection terminals 115 are formed and the edge of the second substrate 120 at which the second connection terminals 125 are formed are inserted into the first socket portion 131 and the second socket portion 135, respectively. For example, the first socket portion 131 and the second socket portion 135 may be disposed vertically in parallel with each other to allow the first substrate 110 and the second substrate 120 to be stacked in parallel with each other.

The first socket portion 131 of the interface connector 130 may include first socket terminals 132 therein to allow connection with the first connection terminals 115. The second socket portion 135 may include second socket terminals 136 to allow connection with the second connection terminals 125.

The first socket terminals 132 are disposed at the first socket portion 131. The first socket terminals 132 are configured to hold a part of the first substrate 110 on which the first connection terminals 115 are disposed within the first socket portion 131. The first socket terminals 132 may be disposed on either a top portion of the first socket portion 131 or a bottom portion of the first socket portion 131.

The second socket terminals 136 are disposed at the second socket portion 135. The second socket terminals 136 are disposed to hold a part of the second substrate 120 on which the second connection terminals 125 are disposed within the second socket portion 135. The second socket terminals 136 may be disposed on either a top portion of the second socket portion 135 or a bottom portion of the second socket portion 135.

The first socket terminals 132 are electrically connected with the second socket terminals 136 through an internal wiring 138. Although a first socket terminal 132 positioned on the top portion of the first socket portion 131 is connected with a second socket terminal 136 positioned on the top portion of the second socket portion 135, and the first socket terminal 132 positioned on the bottom portion of the first socket portion 131 is connected with the second socket terminal 136 positioned on the bottom portion of the second socket portion 135 in FIG. 3, connection between the first socket terminals 132 and the second socket terminals 136 through the internal wiring 138 is not limited to such a connection scheme illustrated in FIG. 3.

The first semiconductor device 111 and the second semiconductor device 121 may be electrically connected to each other through the interface connector 130. More specifically, the first semiconductor device 111 and the second semiconductor device 121 may be connected to each other through the first connection terminal 115, the first socket terminal 132, the internal wiring 138 in the interface connector 130, the second socket terminal 136, and the second connection terminal 125.

At least one of the first substrate 110 and the second substrate 120 may further include a main connector terminal 150 configured to interface connection with an external device. Although the main connector terminal 150 is illustrated as being included in the first substrate 110 in FIG. 3, the main connector terminal 150 may be included in the second substrate 120 instead of the first substrate 110.

In particular, if the main connector terminal 150 is disposed on the first substrate 110, the main connector terminal 150 may be disposed at an edge other than the edge where the first connection terminals 115 are disposed. For example, the main connector terminal 150 may be disposed at an edge that is opposite to the edge where the first connection terminals 115 are disposed. However, in other embodiments, the main connector terminal 150 may be disposed on a different edge.

When the main connector terminal 150 is disposed on the second substrate 120, the main connector terminal 150 may be disposed at an edge other than the edge where the second connection terminals 125 are disposed. For example, the main connector terminal 150 may be disposed at an edge that is opposite to the edge where the second connection terminals 125 are disposed, or other edges similar to when the main connector terminal 150 is disposed on the first substrate 110 as described above.

The main connector terminal 150 may form an interface between the semiconductor memory device 100 and an external device. The main connector terminal 150 may be configured to exchange signals with an external device in relation to electrical configuration and dimensions of terminals according to the Serial Advanced Technology Attachment (SATA) standard, the Parallel Advanced Technology Attachment (PATA) standard, the Small Computer System Interface (SCSI) standard, or other interface standards. Herein, the SATA standard includes any SATA series standard such as the so-called SATA-1, the SATA-2, the SATA-3, the e-SATA (external SATA), and so forth. The PATA standard includes any IDE series standard such as Integrated Drive Electronics (IDE), Enhanced-IDE (E-IDE), and the like. The main connector terminal 150 may be configured to exchange signals with an external device according to the Peripheral Component Interconnect (PCI) interface standard or the PCI express interface standard. The main connector terminal 150 may be configured to exchange signals with the external device according to the Serial Attached SCSI (SAS) standard. Although particular standards have been given as examples for configurations of the main connector terminal 150, the main connector terminal 150 may be formed according to other proprietary and/or non-standard configurations.

If a defect occurs in one of the first substrate 110, the second substrate 120, and the interface connector 130, a defective part is replaceable, such that the defect occurring in manufacturing and maintenance may be handled at a lower cost.

The semiconductor memory device 100 may be, for example, a computer, an ultra mobile personal computer (UMPC), a work station, a net-book, a personal digital assistant (PDA), a portable computer, a web tablet, a tablet computer, a wireless phone, a mobile phone, a smart phone, an e-book, a portable multimedia player (PMP), a portable game console, a navigation system, a black box, a digital camera, a digital multimedia broadcasting (DMB) player, a three-dimensional (3D) television (TV), a smart TV, a digital audio recorder, a digital audio player, a digital picture recorder, a digital picture player, a digital video recorder, a digital video player, a storage forming a data sensor, a device capable of transmitting and receiving information in a wireless environment, one of various electronic devices of a home network, one of various electronic devices of a computer network, one of various electronic devices of a telematics network, a radio frequency identification (RFID) device, one of various components of a computing system, or the like.

The semiconductor memory device 100 may further include the case 140 for receiving the first substrate 110 and the second substrate 120. The case 140 is configured to receive the entire interface connector 130 as well as the first substrate 110 and the second substrate 120. The case 140 is configured to expose the main connector terminal 150. That is, the case 140 may include an opening 145 for exposing the main connector terminal 150 to outside.

The case 140 may be formed of a metallic material, a thermoplastic or thermosetting polymer material, or the like. The case 140 may be formed of a composite material of metals and polymers. The metallic material may be, but not limited to, for example, aluminum (Al), copper (Cu), titanium (Ti), an alloy including one of them, or stainless steel.

The polymer material may be, but not limited to, for example, polystyrene, polypropylene, acrylonitrile-butadiene-styrene (ABS), polycarbonate, polyethyleneterephtalate, polybutyleneterephtalate, polymethyl(met)acrylate, polyester, polyvinylchloride, polyphenylene ether, polyoxymethylene, polyacetal-base resin such as polyoxymethylene, a copolymer thereof, or a combination thereof.

The first substrate 110 and the second substrate 120 may be properly fixed within the case 140. For example, the first substrate 110 and the second substrate 120 may be fixed in the case 140 by means of a screw passing through the first PCB 113 and the second PCB 123.

The case 140 may include two or more parts such as an upper case and a lower case.

Figure 4:
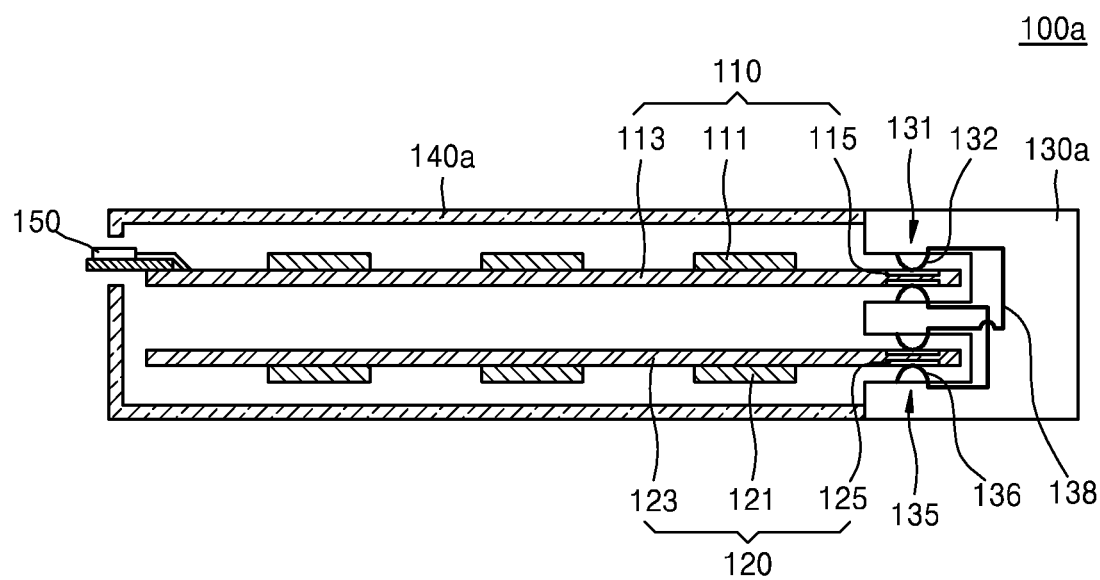
FIGS. 4 and 5 are side cross-sectional views illustrating a cross-section of a semiconductor memory device according to some embodiments.

FIG. 4 is a side cross-sectional view illustrating a cross-section of a semiconductor memory device 100*a* according to some embodiments. The semiconductor memory device 100*a* illustrated in FIG. 4 is different from the semiconductor memory device 100 illustrated in FIG. 3 in a sense that at least a part of an interface connector 130*a* is exposed to the outside of a case 140*a*.

Referring to FIG. 4, the first substrate 110 and the second substrate 120 are inserted and fixed into the first socket terminal 131 and the second socket terminal 135 disposed in the interface connector 130*a*. The case 140*a* is configured to receive the first substrate 110 and the second substrate 120.

As mentioned before, the interface connector 130*a* is exposed to the outside of the case 140*a*. At least one surface of the interface connector 130*a* may be positioned on a plane that is substantially the same as a surface of the case 140*a*.

As illustrated in FIG. 4, a top surface and a bottom surface of the interface connector 130*a*, which are parallel with each other, are exposed to the outside of the case 140*a*, and these two surfaces may form substantially the same plane as that formed by two parallel surfaces of the case 140*a*. A vertical height of the semiconductor memory device 100*a* may be substantially equal to that of the interface connector 130*a*, thus being smaller than that of the semiconductor memory device 100 illustrated in FIG. 3.

The main connector terminal 150 may be disposed on the first substrate 110. In particular, the main connector terminal 150 may be disposed at an edge other than the edge where the first connection terminals 115 are disposed. Although the main connector terminal 150 is illustrated as being disposed on the first substrate 110 in FIG. 4, the main connector terminal 150 may be disposed on the second substrate 120 and in other locations as described above.

Details of the first substrate 110, the second substrate 120, and the interface connector 130*a* have already been described in detail with reference to FIG. 3, and thus a repetitive description thereof will not be disposed.

Figure 5:
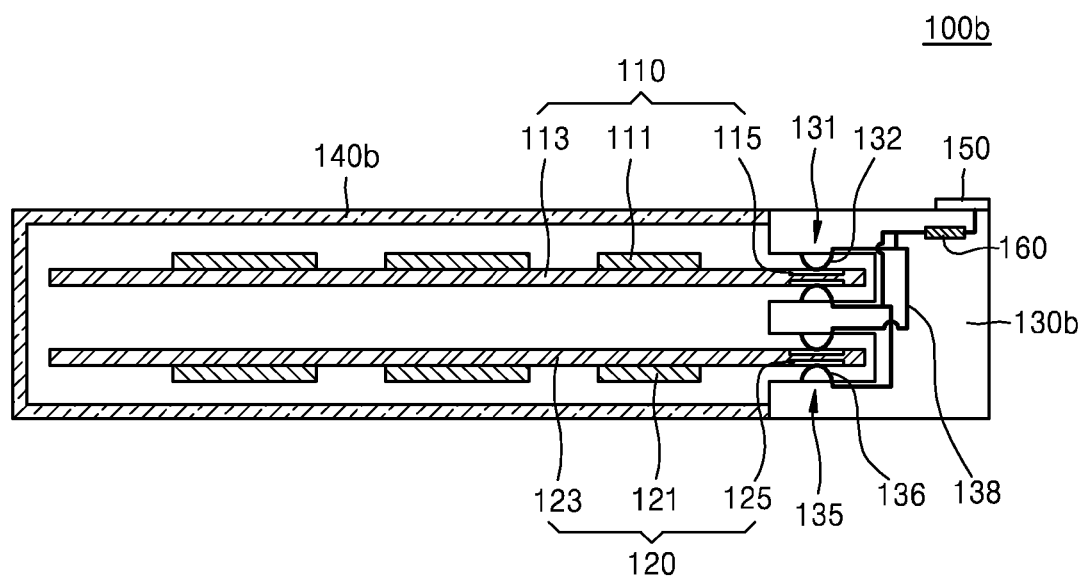

FIG. 5 is a side cross-sectional view illustrating a cross-section of a semiconductor memory device 100*b* according to some embodiments. The semiconductor memory device 100*b* illustrated in FIG. 5 is different from the semiconductor memory device 100*a* illustrated in FIG. 4 in that the main connector terminal 150 is disposed on a surface of an interface connector 130*b*.

Referring to FIG. 5, the first substrate 110 and the second substrate 120 may be inserted and fixed into the first socket terminal 131 and the second socket terminal 135 of the interface connector 130*b*. The case 140*b* may be configured to receive the first substrate 110 and the second substrate 120.

The main connector terminal 150 is disposed on a surface of the interface connector 130*b*, which is exposed to the outside of the case 140*b*. More specifically, the main connector terminal 150 may be disposed along an edge of a side of the interface connector 130*b*.

The main connector terminal 150 is electrically connected with the internal wiring 138 of the interface connector 130*b*. In particular, the main connector terminal 150 interposes at least one electronic element 160 between the main connector terminal 150 and the internal wiring 138 for forming electrical connections with the internal wiring 138.

The electronic element 160 is electrically connected to at least one of the first socket terminal 132 and the second socket terminal 136 through the internal wiring 138.

The at least one electronic element 160 may be an active or passive element. For example, the at least one electronic element 160 may be one or more passive element selected from among a resistor, a capacitor, an inductor, a thermistor, an oscillator, a ferrite bead, an antenna, a varistor, crystal, or the like. The at least one electronic element 160 may be an active element such as a diode, a transistor, an amplifier, or the like.

In the semiconductor memory device 100b according to an embodiment illustrated in FIG. 5, the main connector terminal 150 is disposed on a surface of the interface connector 130b, such that the main connector terminal disposed at the edge other than the edge at which the first connection terminals 115 are disposed may be unnecessary and thus removed from the semiconductor memory device 100b. Thus, the case 140b may not include an opening for exposing such a main connector terminal. The first substrate 110 and the second substrate 120 may be completely received in a space defined by the case 140b and the interface connector 130b.

Details of the first substrate 110, the second substrate 120, and the interface connector 130b have been already described with reference to FIG. 3 and thus will not be repetitively described herein.

Figure 6:
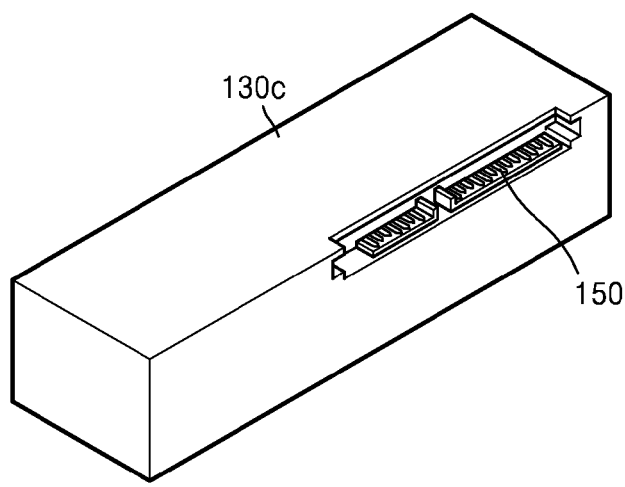
FIG. 6 is a perspective view of an interface connector according to an embodiment.

The main connector terminal 150 disposed in the interface connector 130b may be configured to satisfy one of various standards including the SATA, for example, the SATA standard, the PATA standard, the SCSI standard, the PCI standard, the SAS standard, or the like as described above. To this end, for example, as illustrated in FIG. 6, a part of an interface connector 130c is recessed and the main connector terminal 150 is disposed in the recessed part. Alternatively, a part of the interface connector 130c may protrude and the main connector terminal 150 may be disposed in the protruding part.

Figure 7:
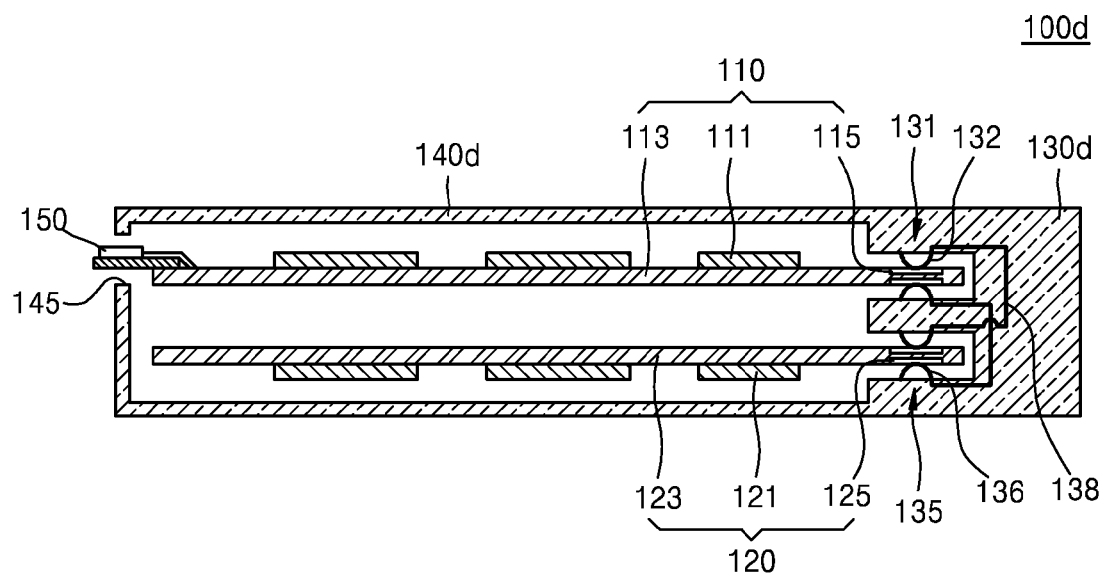
FIGS. 7 to 11 are side cross-sectional views illustrating a cross-section of a semiconductor memory device according to some embodiments.
Figure 8:
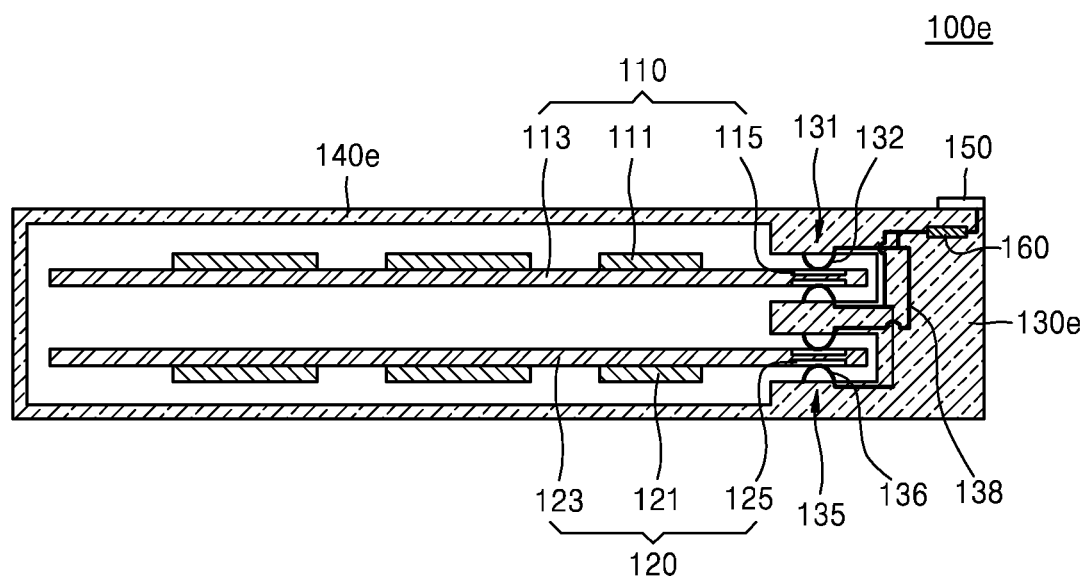

FIGS. 7 and 8 are side cross-sectional views illustrating cross-sections of semiconductor memory devices 100d and 100e according to some embodiments. The semiconductor memory devices 100d and 100e are different from the semiconductor memory devices 100a and 100b illustrated in FIGS. 4 and 5 in a sense that cases 140d and 140e are configured integrally with interface connectors 130d and 130e.

Referring to FIGS. 7 and 8, the cases 140d and 140e are formed of the same materials as those of the interface connectors 130d and 130e and may be configured not to be separable. Although the cases 140d and 140e are illustrated as being integrated with the interface connectors 130d and 130e in FIG. 7, a part of the cases 140d and 140e may be configured integral with the interface connectors 130d and 130e and the other part of the cases 140d and 140e may be configured separable from the interface connectors 130d and 130e.

Referring to FIG. 7, the case 140d integrally connected with the interface connector 130d may include the opening 145 for exposing the main connector terminal 150. While the main connector terminal 150 is illustrated as being disposed on the first substrate 110, it may also be disposed on the second substrate 120, or in other locations as described above.

Referring to FIG. 8, the main connector terminal 150 is disposed on the surface of the interface connector 130e connected integrally with the case 140e. Thus, the case 140e does not need an opening for exposing an edge of a side of the first substrate 110 and the second substrate 120. Thus, the first substrate 110 and the second substrate 120 may be entirely surrounded by the case 140e and the interface connector 130e that are formed integrally with each other.

Other components have already been described in detail with reference to FIGS. 3 and 4, and thus will not be repetitively described.

Figure 9:
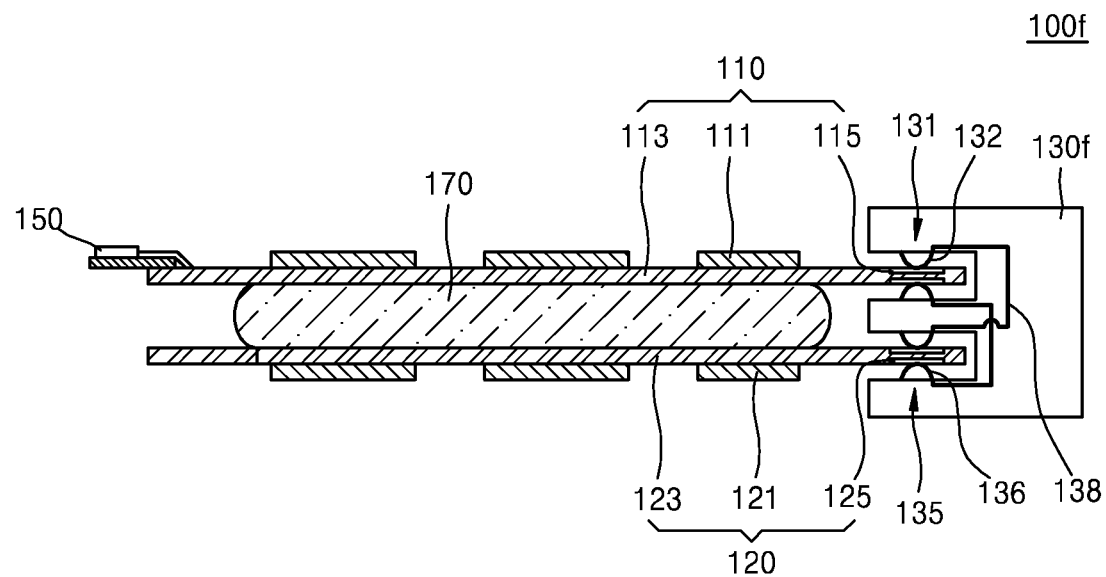
Figure 10:
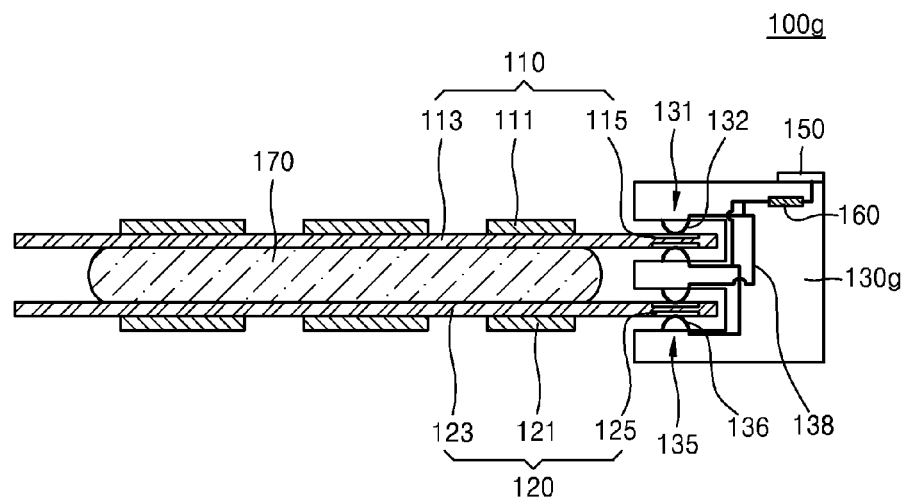

FIGS. 9 and 10 are side cross-sectional views illustrating cross-sections of semiconductor memory devices 100f and 100g according to some embodiments. The semiconductor memory devices 100f and 100g illustrated in FIGS. 9 and 10 are different from the semiconductor memory devices 100a and 100b illustrated in FIGS. 4 and 5 in a sense that the semiconductor memory devices 100f and 100g do not include cases.

Referring to FIGS. 9 and 10, the first PCB 113 and the second PCB 123 are adhered to each other using an adhesive member 170. The adhesive member 170 may be an adhesive paste or an adhesive film. The adhesive paste may be, but not limited to, for example, a polyurethane-base, polyester-base, polyimide-base, or epoxy-base adhesive paste. However, the adhesive member 170 may be a pressure-sensitive adhesive, an ultraviolet (UV)-curable adhesive, an air-curable adhesive, a moisture-curable adhesive, or other suitable types of adhesives.

The adhesive film may include, but not limited to, a polymeric composition including alkyl acrylate having an alkyl group with a carbon number of 3 to 14.

Other components have already been described in detail with reference to FIGS. 3-5 and will not be repetitively described.

When the semiconductor memory devices 100f and 100g are configured as shown in FIGS. 9 and 10, they are usefully applied as parts for manufacturing a low-weight and small-thickness electronic device. Because of having no case, the embodiment of FIGS. 9 and 10 may be configured to have lower weight and smaller thickness.

Figure 11:
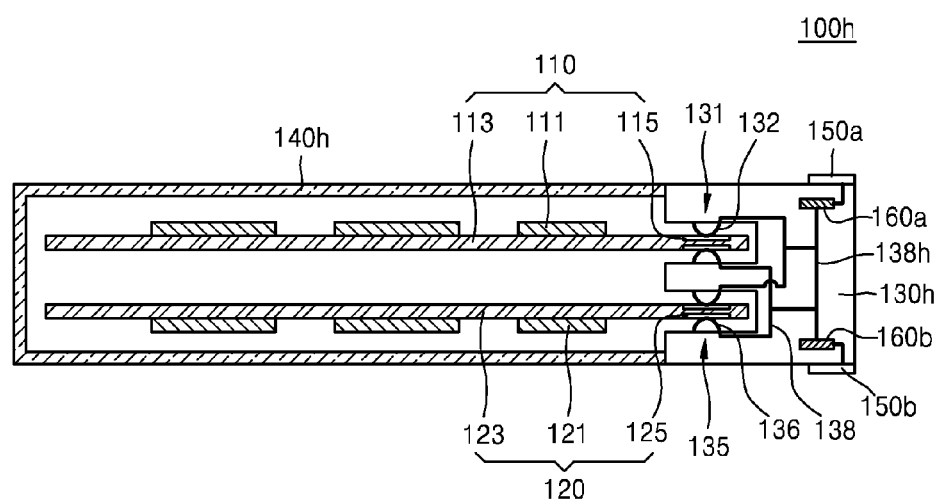

FIG. 11 is a side cross-sectional view illustrating a cross-section of a semiconductor memory device 100h according to some embodiments. The semiconductor memory device 100h illustrated in FIG. 11 is different from the semiconductor memory device 100b illustrated in FIG. 5, in a sense that two sets of main connector terminals 150a and 150b are disposed on different surfaces of an interface connector 130h.

Referring to FIG. 11, the first substrate 110 and the second substrate 120 are inserted and fixed into the first socket terminal 131 and the second socket terminal 135 disposed in the interface connector 130h. A case 140h may be configured to receive the first substrate 110 and the second substrate 120.

At least two main connector terminals 150a and 150b may be disposed on the surface of the interface connector 130h. For example, the at least two main connector terminals 150a and 150b may include first main connector terminals 150a and second main connector terminals 150b. The first main connector terminals 150a and the second main connector terminals 150b may be main connector terminals based on different standards or different form factors. For example, the first main connector terminals 150a are main connector terminals complying with the SATA standard, and the second main connector terminals 150b are main connector terminals complying with the PCI standard. Although a particular pairing of main connector terminals and standards have been used as an example, in other embodiments, the main connector terminals 150a and 150b may be paired with different standards, or no standard at all.

The at least two main connector terminals 150a and 150b are formed on different areas, respectively. For example, the first main connector terminals 150a may be disposed on a top surface of the interface connector 130h, and the second main connector terminals 150b may be disposed on a bottom surface of the interface connector 130h. However, in other embodiments, the at least two main connector terminals 150a and 150b may be disposed in other locations, including on the same side and/or edge of the interface connector 130h.

Although the two main connector terminals 150a and 150b are illustrated in FIG. 11, three or more sets of main connector terminals may be disposed on the interface connector 130h and electrically connected to one or more of the first substrate 110 and the second substrate 120.

In the interface connector 130h, electronic elements 160a and 160b for the first main connector terminals 150a and the second main connector terminals 150b may be disposed. The electronic elements 160a and 160b have already been described in detail with reference to FIG. 5, and thus will not be repetitively described.

The electronic elements 160a and 160b may be connected to the first socket terminal 132 and the second socket terminal 136 through an internal wiring 138h.

If one of the at least two sets of the main connector terminals 150a and 150b is connected with an external device, the other main connector terminal(s) may or may not be connected with the external device.

Figure 12:
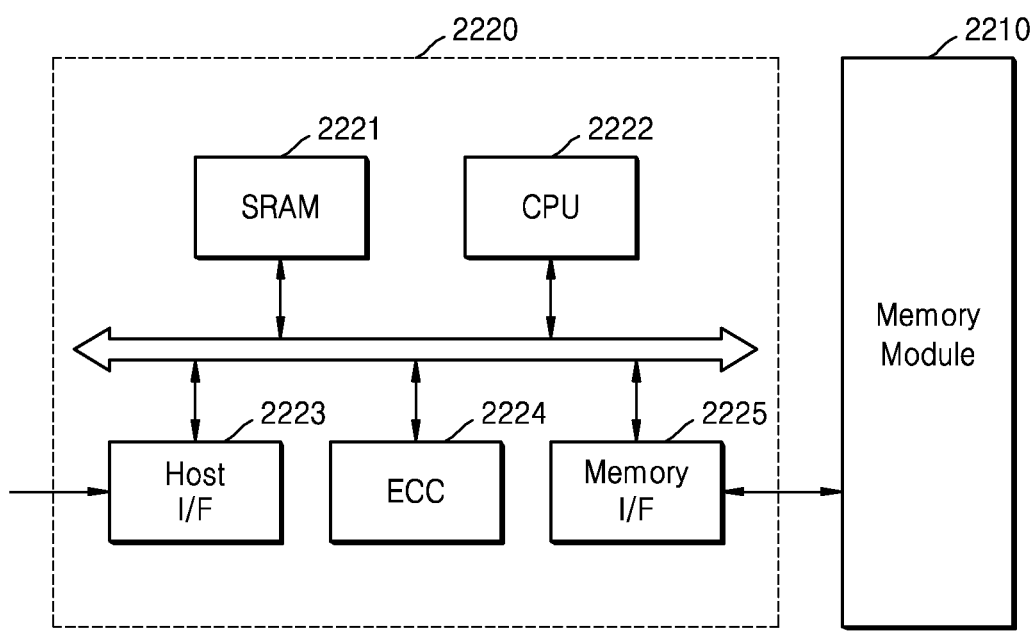
FIG. 12 is a block diagram illustrating an example of a memory system including a semiconductor memory device according to some embodiments.

FIG. 12 is a block diagram illustrating an example of a memory system 2200 including a semiconductor memory device according to some embodiments.

Referring to FIG. 12, the memory system 2200 according to an embodiment includes a memory module 2210. The memory module 2210 includes at least one of the semiconductor devices disclosed herein. The memory module 2210 may further include another type of a semiconductor memory device (for example, a non-volatile memory device and/or an SRAM device). The memory system 2200 may include a memory controller 2220 for controlling data exchange between a host and the memory module 2210.

The memory controller 2220 may include a processing unit 2222 configured to control an overall operation of a memory card. The memory controller 2220 may include a synchronous random access memory (SRAM) 2221 used as an operating memory of the processing unit 2222. In addition, the memory controller 2220 may further include a host interface 2223 and a memory interface 2225. The host interface 2223 may be configured to implement a data exchange protocol between the memory system 2200 and the host. The memory interface 2225 may connect the memory system 2220 with the memory device 2210. Moreover, the memory controller 2220 may include an error correction (ECC) block 2224. The ECC block 2224 detects and corrects an error of data read from the memory module 2210. Although not shown, the memory system 2200 may further include a Read Only Memory (ROM) device that stores code data for interfacing with the host. The memory system 2200 may be implemented as a solid state drive (SSD) capable of replacing with a hard disk of a computer system.

Figure 13:
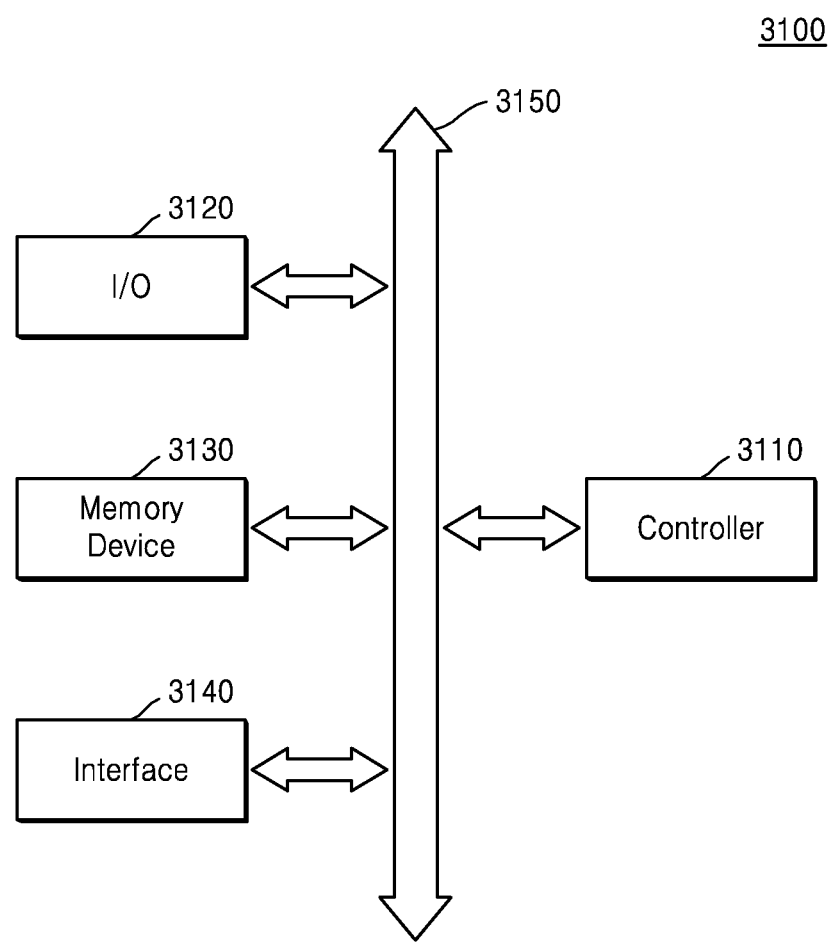
FIG. 13 is a block diagram illustrating an example of an electronic system including a semiconductor memory device according to some embodiments.

FIG. 13 is a block diagram illustrating an example of an electronic system 3100 including a semiconductor memory device according to some embodiments.

Referring to FIG. 13, the electronic system 3100 according to an embodiment may include a controller 3110, an input/output (I/O) device 3120, a memory device 3130, an interface 3140, and a bus 3150. The controller 3110, the I/O device 3120, the memory device 3130, and/or the interface 3140 may be coupled to one another through the bus 3150. The bus 3150 may be a path configured to transfer data.

The controller 3110 may include at least one of a microprocessor, a digital signal processor, a micro-controller, logic elements capable of performing similar functions, or the like. The I/O device 3120 may include a keypad, a keyboard, a display device, or the like. The memory device 3130 may be configured to store data and/or commands. The memory device 3130 may include at least one of semiconductor memory devices described herein. The memory device 3130 may further include another type of a semiconductor memory device (for example, a non-volatile memory device and/or an SRAM device). The interface 3140 may be configured to perform a function of transmitting data to a communication network or receiving the data from the communication network. The interface 3140 may be in a wired or wireless form. For example, the interface 3140 may include an antenna or a wired/wireless transceiver. Although not shown, the electronic system 3100 may further include a high-speed dynamic random access memory (DRAM) device and/or a synchronous RAM (SRAM) device as an operation memory device for improving an operation of the controller 3110.

The electronic system 3100 may be applicable to a personal digital assistant (PDA) portable computer, a web tablet, a wireless phone, a mobile phone, a digital music player, a memory card, or any electronic product capable of transmitting and/or receiving information in a wireless environment.

Figure 14:
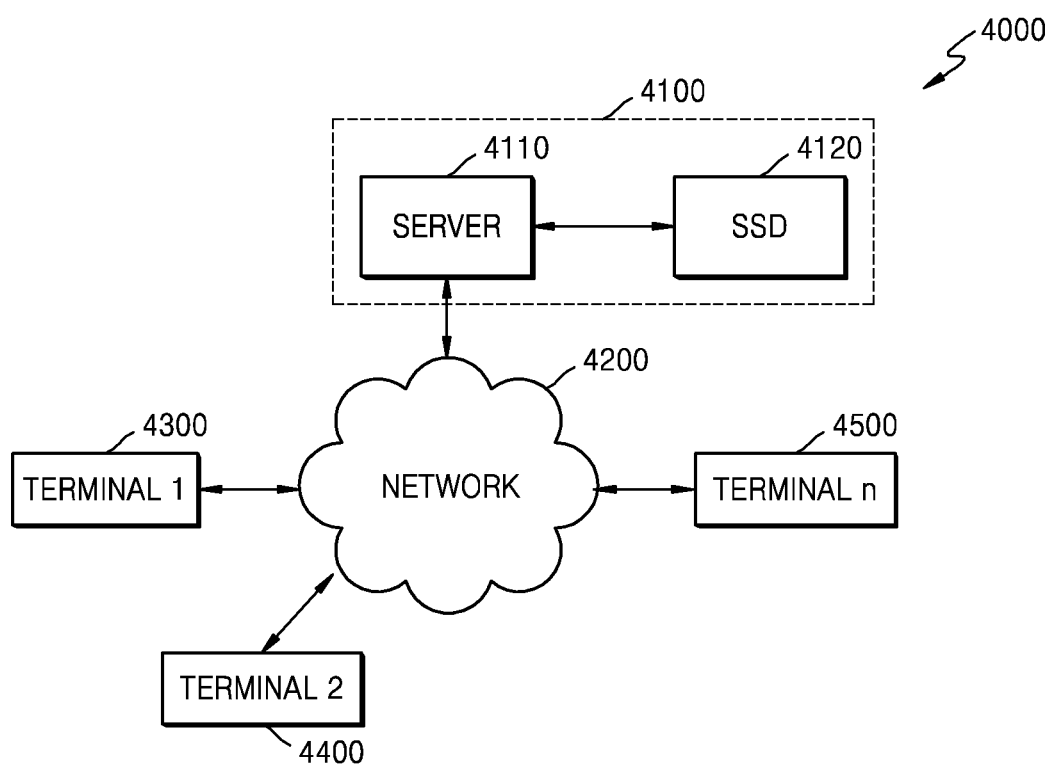
FIG. 14 is a block diagram illustrating a network implementation example for a server system including a semiconductor memory device according to some embodiments.

FIG. 14 is a block diagram illustrating a network implementation example for a server system including a semiconductor memory device according to some embodiments.

Referring to FIG. 14, a network system 4000 according to an embodiment may include a server system 4100 and multiple terminals 4300, 4400, and 4500 which are connected over a network 4200. The server system 4100 according to an embodiment may include a server 4110 that processes a request received from the multiple terminals 4300, 4400, and 4500 connected to the network 4200 and an electronic device 4120 that stores data corresponding to the request received from the terminals 4300, 4400, and 4500. The semiconductor memory device according to an embodiment illustrated in FIGS. 3 to 11 may be applied to the electronic device 4120. The electronic device 4120 may be, for example, an SSD.

The above-described electronic device according to an embodiment may be configured using various forms of packages. For example, the electronic device according to an embodiment may be configured using packages such as a Package on Package (PoP), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic MetricQuad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), and a Wafer-Level Processed Stack Package (WSP).

Some embodiments include a semiconductor memory device which is favorable to miniaturization, is easy to manufacture, and is partially replaceable when a defect occurs in a part.

Some embodiments include a semiconductor memory device including: a first substrate on which a first semiconductor device is mounted and which includes a first connection terminal at an edge of a side thereof; a second substrate on which a second semiconductor device is mounted and which includes a second connection terminal at an edge of a side thereof; and an interface connector including a first socket portion and a second socket portion capable of receiving the first connection terminal and the second connection terminal, respectively. First socket terminals connected with the first connection terminals may be provided in the first socket portion, and second socket terminals connected with the second connection terminals may be provided in the second socket portion. Also, an internal wiring for electrically connecting the first socket terminals with the second socket terminals may be provided in the interface connector.

The first socket portion and the second socket portion may be disposed such that the first substrate and the second substrate are stacked in parallel with each other. At least one of the first substrate and the second substrate may further include a main connector terminal at an edge other than an edge at which the first connection terminal or the second connection terminal is provided.

The semiconductor memory device may further include a case that receives the first substrate and the second substrate. The interface connector may be received in the case.

At least a part of the interface connector may be exposed to an outside of the case. Here, at least one of the first substrate and the second substrate may further include a main connector terminal at an edge other than an edge at which the first connection terminal is provided. A main connector terminal may be provided on a surface of the interface connector exposed to the outside of the case. A part of the interface connector on which the main connector terminal is provided may have a connector dimension according to the Serial Advanced Technology Attachment (SATA) standard, the Parallel Advanced Technology Attachment (PATA) standard, the Small Computer System Interface (SCSI) standard, the Peripheral Component Interconnect (PCI) interface standard, or the Serial Attached SCSI (SAS) standard.

The main connector terminals may include at least two sets of main connector terminals, and the at least two sets of the main connector terminals are main connector terminals according to different standards or different form factors.

The semiconductor memory device may further include an electronic element in the interface connector, wherein the electronic element is electrically connected with at least one of the first socket terminal and the second socket terminal.

The semiconductor memory device may further include a case that receives the first substrate and the second substrate, wherein the interface connector is formed integrally with the case. Here, at least one of the first substrate and the second substrate may further include a main connector terminal at an edge other than an edge at which the first connection terminal or the second connection terminal is provided. The semiconductor memory device may further include a main connector terminal on a surface of the case.

The semiconductor memory device may further include a main connector terminal on a surface of the interface connector. Here, the first substrate and the second substrate may be fixed to each other by means of an adhesive member.

Some embodiments include a semiconductor memory device including: a first substrate on which a first semiconductor device is mounted and which includes a first connection terminal at an edge of a side thereof; an interface connector including a first socket portion capable of receiving the first connection terminal; and a case which exposes the interface connector while receiving the first substrate. Here, a main connector terminal may be provided on a surface of the interface connector.

While embodiments have been particularly shown and described with reference to the drawings, it will be understood that various changes in form and details may be made therein without departing from the spirit and scope of the following claims.

What is claimed is:

1. A semiconductor memory device, comprising:
   a first substrate including a first semiconductor device mounted on the first substrate and a first connection terminal disposed at an edge of the first substrate;
   a second substrate including a second semiconductor device mounted on the second substrate and a second connection terminal disposed at an edge of the second substrate;
   an interface connector including a first socket portion configured to receive the first connection terminal and a second socket portion configured to receive the second connection terminal; and
   a case configured to receive the first substrate and the second substrate;
   wherein:
      the interface connector further includes:
         first socket terminals of the first socket portion are connected with the first connection terminals;
         second socket terminals of the second socket portion are connected with the second connection terminals; and
         an internal wiring for electrically connecting the first socket terminals with the second socket terminals; and
      at least a part of the interface connector is exposed outside of the case.

2. The semiconductor memory device of claim 1, wherein the first socket portion and the second socket portion are disposed such that the first substrate and the second substrate are stacked in parallel with each other.

3. The semiconductor memory device of claim 1, wherein at least one of the first substrate and the second substrate further comprises a main connector terminal at an edge other than an edge at which the first connection terminal or the second connection terminal is disposed.

4. The semiconductor memory device of claim 1, wherein the interface connector is received in the case.

5. The semiconductor memory device of claim 1, wherein a main connector terminal is provided on a surface of the interface connector exposed outside of the case.

6. The semiconductor memory device of claim 5, wherein a part of the interface connector on which the main connector terminal is provided has a connector dimension according to the Serial Advanced Technology Attachment (SATA) standard, the Parallel Advanced Technology Attachment (PATA) standard, the Small Computer System Interface (SCSI) standard, the Peripheral Component Interconnect (PCI) interface standard, or the Serial Attached SCSI (SAS) standard.

7. The semiconductor memory device of claim 1, further comprising:
   at least two main connector terminals coupled to at least one of the first substrate and the second substrate;
   wherein at least one of the at least two main connector terminals is formed according to a different standard or a different form factors that another of the at least two main connector terminals.

8. The semiconductor memory device of claim 1, further comprising:
   an electronic element in the interface connector;

wherein the electronic element is electrically connected with at least one of the first socket terminal and the second socket terminal.

9. The semiconductor memory device of claim 1, wherein the interface connector is formed integrally with the case.

10. The semiconductor memory device of claim 9, further comprising a main connector terminal disposed on a surface of the case.

11. The semiconductor memory device of claim 1, further comprising:
   a main connector terminal disposed on a surface of the interface connector;
   wherein the first substrate and the second substrate are fixed to each other by an adhesive member.

12. A semiconductor memory device comprising:
   a first substrate including a first semiconductor device mounted on the first substrate and a first connection terminal disposed at an edge of the first substrate;
   a second substrate including a second semiconductor device mounted on the second substrate and a second connection terminal disposed at an edge of the second substrate;
   an interface connector comprising a first socket portion configured to receive the first connection terminal and a second socket portion configured to receive the second connection terminal; and
   a case exposing the interface connector and configured to receive the first substrate and the second substrate;
   wherein a main connector terminal is disposed on a surface of the interface connector.

13. A semiconductor memory device, comprising:
   an interface connector comprising a plurality of socket portions disposed on a side of the interface connector;
   a plurality of substrates, each substrate including a semiconductor device and including a connection terminal contacting a corresponding socket portion of the interface connector;
   a case substantially surrounding the substrates and including an opening; and
   a main connector terminal disposed on one of the substrates; and
   an adhesive member coupled between the substrates;
   wherein a semiconductor device of the substrates without the main connector terminal are configured to be accessed through the main connector terminal and the interface connector.

14. The semiconductor memory device of claim 13, wherein the case substantially surrounds the interface connector.

15. The semiconductor memory device of claim 13, wherein:
   the main connector terminal comprises a plurality of main connector terminals; and
   each main connector terminal is configured to present a standard interface and provide access to the semiconductor devices of the substrates.

16. The semiconductor memory device of claim 13, wherein at least one of the substrates includes a memory controller.

* * * * *